Figure 1:
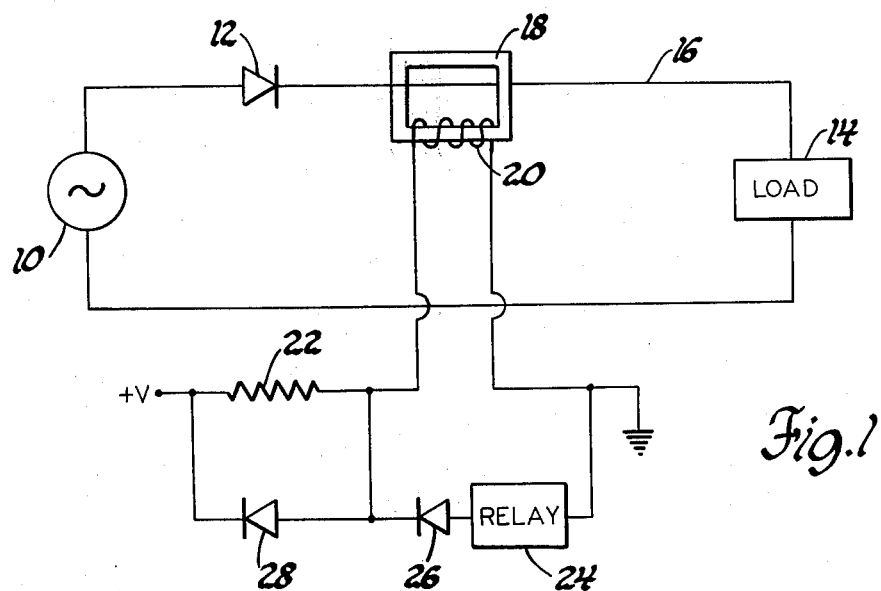

United States Patent [19]
Johnson

[11] 4,217,621
[45] Aug. 12, 1980

[54] CIRCUIT FOR DETECTING DIODE SHORTING

[75] Inventor: Lauren L. Johnson, Westchester, Ill.

[73] Assignee: General Motors Corporation, Detroit, Mich.

[21] Appl. No.: 944,758

[22] Filed: Sep. 22, 1978

[51] Int. Cl.² ............................................. H01H 47/22
[52] U.S. Cl. ....................................... 361/170; 340/645
[58] Field of Search ........................... 361/1, 160, 170; 340/645, 653

[56] References Cited
U.S. PATENT DOCUMENTS

| | | |
|---|---|---|
| 3,045,168 | 7/1962 | Fellendorf . |
| 3,493,839 | 2/1970 | De Puy .......................... 340/645 X |
| 3,899,737 | 8/1975 | Aston . |

FOREIGN PATENT DOCUMENTS 704746  3/1954  United Kingdom ..................... 340/645

Primary Examiner—Harry E. Moose, Jr.
Attorney, Agent, or Firm—Warren D. Hill

[57] ABSTRACT

A circuit for detecting the shorting of a diode in a circuit for rectifying AC current. A current transformer senses the current flowing through a diode. A DC bias current applied to the transformer secondary winding along with the unidirectional pulses normally passed by the diode cause saturation of the transformer core so that the normal current passed by the diode does not induce corresponding pulses in the secondary winding. In the event of diode shorting reverse current pulses will produce corresponding pulses in the secondary winding and those pulses are detected by a relay so that relay actuation occurs upon diode shorting.

2 Claims, 2 Drawing Figures

U.S. Patent  Aug. 12, 1980  4,217,621

CIRCUIT FOR DETECTING DIODE SHORTING

This invention relates to a circuit for detecting the shorting of a diode in a rectifying circuit.

In heavy duty electrical generating equipment such as that used in diesel electric locomotives it is often the practice to use an alternating current generator and to produce a DC current therefrom by a diode bridge rectifying circuit. In the event a diode becomes shorted a generator winding associated with that diode is also shorted creating a danger of overloading. Some means of detecting the occurrence of such a diode shorting is necessary to allow protective measures to be taken to avoid generator overloading. In the past diode fuses have been used to provide such detection and it has been known to detect fuse opening to provide an indication of diode failure. Where, however, fuses are not desired another diode failure detection scheme is required.

It is, therefore, a general object of the invention to provide a circuit for detecting shorting of a diode in an AC rectifying circuit.

The invention is carried out by providing a current transformer responsive to the current flowing through each diode and having a core saturated by rectified current pulses such that substantially no corresponding pulses appear in the transformer secondary, but when reverse pulses appear due to diode shorting, corresponding pulses do occur in the transformer secondary; and a detection device responsive to the secondary winding pulses to indicate diode shorting. The invention further contemplates a DC bias supplied to the secondary winding of the current transformer to assure saturation of the transformer core in the direction to prevent pulses in the secondary winding due to normal rectified primary current.

Figure 2:
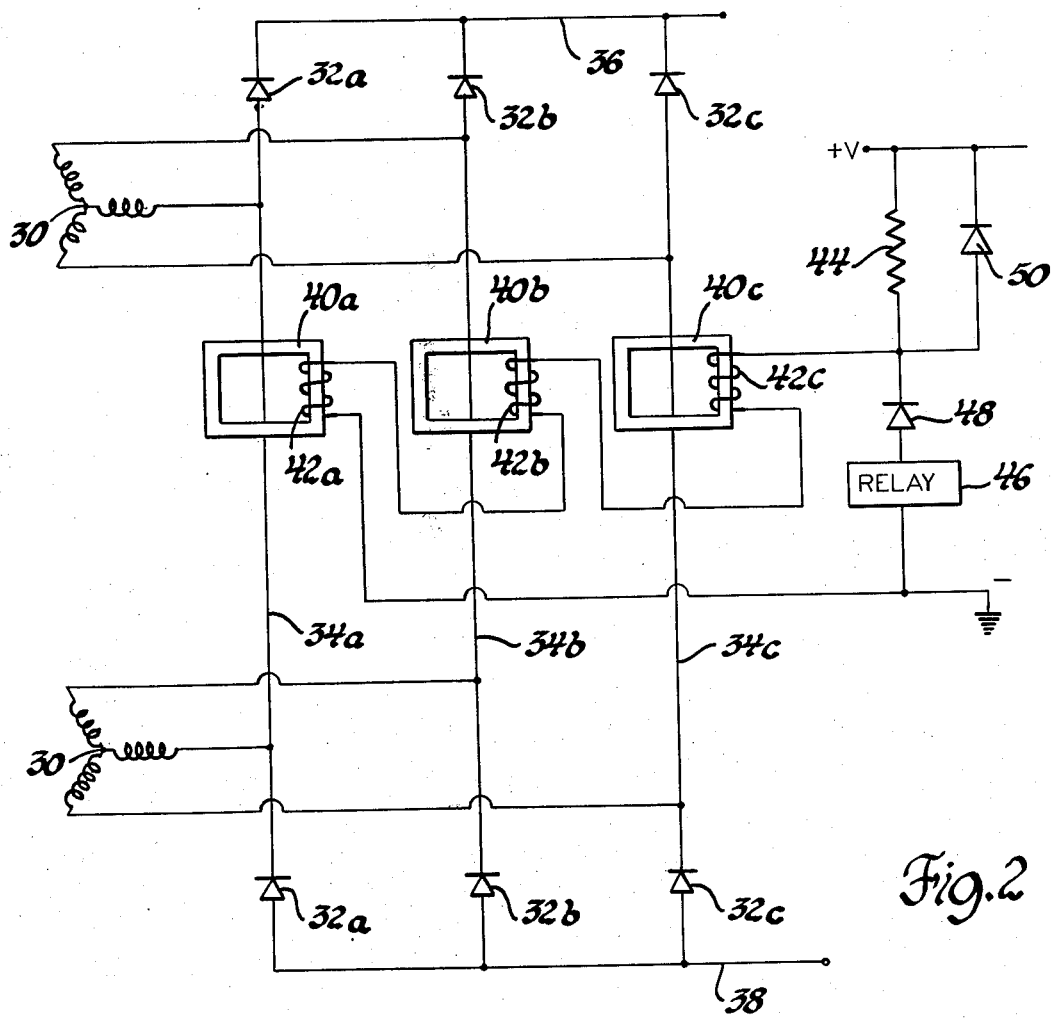

The above and other advantages will be made more apparent from the following specification taken in conjunction with the accompanying drawings wherein like reference numerals refer to like parts and wherein:

FIG. 1 is a schematic diagram of a rectifier circuit equipped with a diode short detector illustrating the principle of the invention, and FIG. 2 is a schematic diagram of a polyphase rectifier circuit equipped with a diode short condition detector according to the invention.

FIG. 1 illustrates the principle of the invention by applying it to a single phase circuit with halfwave rectification in that circuit. An alternating current source 10 is connected in series with a diode 12 and a load impedance 14. Normally the diode 12 conducts only in one direction so that halfwave rectification occurs. Unidirectional current pulses, therefore, pass through the load 14. A conductor 16 connects the diode cathode to the load 14. A current transformer having a core 18 is arranged with the conductor 16 passing through its window so that the conductor 16 serves as the primary winding. The secondary winding 20 arranged on the core is connected in series with a resistor 22 which, in turn, is connected to a positive voltage source (+V) so that a DC bias current will flow through the resistor 22 to the secondary coil 20 to ground. A relay 24 and a diode 26 in series are connected across the coil 20. A second diode 28 is connected across the resistor 22.

Preferably, the current transformer is a conventional high quality current transformer with a core having substantially a square hysteresis loop. The transformer is so selected with respect to the current normally conducted in the conductor 16 so that such current causes saturation or near saturation of the core 18. The transformer is so wound that if the core were not saturated, the normal unidirectional pulses in the conductor 16 would induce corresponding pulses in the secondary winding in a direction to flow from ground through the coil and the diode 20 to the positive voltage source and back to ground. The diode 26 is poled so as to prevent any such current flow through the relay 24. The bias current flowing from the positive voltage source and through the resistor 22 and the coil 20 to ground is in a direction to add to the core flux arising from the unidirectional pulses in the conductor 16 so as to assure continued core saturation even in the case where a lower quality core material not representing a square hysteresis loop is not utilized. In certain applications, however, where square hysteresis loop core material is used the bias current through the resistor 22 is not essential to proper detector operation. The diode 26 prevents the flow of the bias current through the relay 24.

In the event of diode shorting alternating current will occur in the conductor 16. The undesired reverse pulse will drive the transformer core 18 from its saturated condition to produce a substantial pulse in the secondary winding 20 in such a direction that current flows through the relay 24 and the diode 26. The relay is thus actuated to provide a diode failure indication either in the form of a visual or other sensory warning.

FIG. 2 represents the diode short detection scheme as applied to the generator of a diesel locomotive. There the generator is an alternating current source having two sections of three phase windings 30. A rectifier bridge has three sections or branches each comprising a pair of diodes 32a, 32b and 32c, the diodes of each pair being interconnected by a conductor 34a, 34b or 34c. Each conductor 34 interconnects like windings of the generator sections 30 to place the windings in parallel in a manner that is very well known. Thus, the AC current is rectified to produce on output buses 36 and 38 DC current having positive and negative polarity respectively. Those output buses are connected to a load impedance, not shown, which comprises the traction motors of the locomotive. The conductors 34a, b and c comprise the primary windings of current transformers having saturable cores 40a, 40b and 40c respectively. In each section of the rectifier bridge, the transformer core is positioned not only between the two diodes but between the two winding sections 30 so that regardless of which diode might fail, shorting current will flow from one of the winding sections through the transformer and through the diode. The secondary windings 42a, 42b and 42c are connected in series and further are serially connected with a resistor 44 to the positive voltage source so that DC bias current to maintain core saturation will flow serially through the three windings to ground. A relay 46 and diode 48 are serially connected and in combination are across the three secondary windings 42 so that when a diode 32 short causes a reverse pulse which induces a corresponding pulse in any one of the secondary windings, that pulse will pass through the relay 46 and diode 48. A diode 50 across the resistor 44 is optionally used to pass transient pulses occurring only on the initial cycle of system energization. The principle of operation of the detection scheme in FIG. 2 is the same as that already described with respect to FIG. 1; the relay 46 is energized whenever a reverse pulse due to a diode failure occurs to produce a corresponding pulse in the secondary winding 42.

It wll thus be seen that according to the present invention a diode shorting detection circuit is provided which is sensitive to any nonrectified reverse pulse in a rectifier circuit, the detection circuit requiring a minimum of components and having minimal impact on the rectifier arrangement.

The embodiments of the invention in which an exclusive property or privilege is claimed are defined as follows:

1. Means for detecting shorting of a diode in a circuit for rectifying AC current including a conductor in series with the diode and carrying unidirectional current from an AC source, comprising a current transformer including a saturable core of square hysteresis loop material, a primary winding comprising the said conductor, and a secondary winding, means consisting of the unidirectional current pulses resulting from normal diode conduction and flowing in the said conductor for saturating said core so that said unidirectional pulses induce substantially no corresponding pulses in the secondary winding and wherein, in the event of a shorted diode, alternating current is applied to said conductor and the resulting reverse current pulses drive the core out of saturation and produce corresponding current pulses in the secondary winding, and means responsive to current pulses in the secondary winding derived from the reverse current pulses in the said conductor for indicating diode shorting.

2. Means for detecting shorting of a diode in a bridge circuit for rectifying current from a polyphase AC source wherein the bridge has a plurality of rectifying sections connected in parallel across the bridge output, each section comprising a pair of diodes and a primary conductor serially joining the pair of diodes and connected to the AC source for carrying unidirectional current pulses passed by the diodes during normal conduction and also carrying AC current in the event of shorting of a diode, comprising a current transformer associated with each section of the bridge wherein each transformer includes a saturable core of square hysteresis loop material, a primary winding comprising the said primary conductor corresponding thereto, and a secondary winding, means consisting of the unidirectional current pulses flowing in said primary conductors for saturating the cores so that said unidirectional current pulses resulting from normal diode conduction induce substantially no corresponding pulses in the secondary winding and wherein, in the event of a shorted diode, alternating current is applied to the respective primary conductor and the resulting reverse current pulses drive the respective core out of saturation and produce corresponding current pulses in the respective secondary winding, and a detecting circuit comprising the secondary windings connected in series, relay means and a diode connected in series with the secondary windings such that the relay means is responsive only to current pulses in any of said secondary windings derived from reverse current pulses in its respective primary conductor for indicating diode shorting.

* * * * *